(12) United States Patent
Awad et al.

(10) Patent No.: US 11,694,853 B2
(45) Date of Patent: Jul. 4, 2023

(54) FLEXIBLE SOLAR PANEL

(71) Applicant: KING SAUD UNIVERSITY, Riyadh (SA)

(72) Inventors: Manal Ahmed Gasmelseed Awad, Riyadh (SA); Awatif Ahmed Hendi, Riyadh (SA); Khalid Mustafa Osman Ortashi, Riyadh (SA)

(73) Assignee: KING SAUD UNIVERSITY, Riyadh (SA)

( * ) Notice: Subject to any disclaimer, the term of this patent is extended or adjusted under 35 U.S.C. 154(b) by 0 days.

(21) Appl. No.: 17/116,683

(22) Filed: Dec. 9, 2020

(65) Prior Publication Data
US 2021/0104368 A1    Apr. 8, 2021

Related U.S. Application Data

(62) Division of application No. 15/098,242, filed on Apr. 13, 2016, now Pat. No. 10,886,073.

(51) Int. Cl.
| | | |
|---|---|---|
| *H01L 31/00* | (2006.01) | |
| *H01G 9/20* | (2006.01) | |
| *H01L 51/00* | (2006.01) | |
| *B29C 41/00* | (2006.01) | |

(52) U.S. Cl.
CPC .......... *H01G 9/2059* (2013.01); *B29C 41/003* (2013.01); *H01G 9/204* (2013.01); *H01G 9/2031* (2013.01); *H01G 9/2095* (2013.01); *H01L 51/0093* (2013.01); *B29K 2995/0018* (2013.01); *H01L 51/0097* (2013.01)

(58) Field of Classification Search
CPC .......................... H01L 51/0093; H01G 9/2059
USPC ......................................................... 136/263
See application file for complete search history.

(56) References Cited

U.S. PATENT DOCUMENTS

| | | |
|---|---|---|
| 4,989,956 A | 2/1991 | Wu et al. |
| 2008/0245411 A1 | 10/2008 | Hammermann et al. |
| 2010/0193010 A1 | 8/2010 | Wells |
| 2015/0295100 A1 | 10/2015 | Chen et al. |

FOREIGN PATENT DOCUMENTS

WO    WO 2014/182589 A1    11/2014

OTHER PUBLICATIONS

Calogero et al., "Anthocyanins and Betalains as Light-Harvesting Pigments for Dye-Sensitized Solar Cells," Solar Energy 86 (2012) 1563-1575 (Year: 2012).*
Hernández-Martinez et al., "Stabilized Conversion Efficiency and Dye-Sensitized Solar cells from Beta vulgaris Pigment," Int. J. Mol. Sci. 2013, 14, 4081-4093; doi:10.3390/ijms14024081 (Year: 2013).*
Ochiai ("Photocurrent by Immobilized Chloroplast Film Electrode"), Agric. Biol. Chem., 43 (4), 881- 883, 1979 (Year: 1979).*
Yang ("Preparation of Photostable Chlorophyll/PVA Film"), Advanced Materials Research, vols. 239-242, pp. 2707-2710 (Year: 2011).*
Pavokovic ("Complex Biochemistry and Biotechnological Production of Betalains"), Food Technol. Biotechnol. 49 (2) 145-155 (2011) (Year: 2011).*
Rahman et al., "Interference Pigment Coated Solar Cells for Use in High Radiant Flux Environments," Jordan Journal of Mechanical and Industrial Engineering, Jan. 2010, vol. 4, pp. 129-134.
Azhari et al., "Fabrication of Low Cost Sensitized Solar Cell Using Natural Plant Pigment dyes," Journal of Engineering and Applied Sciences, Sep. 2015, vol. 10, pp. 7092-7096.
Summoogum-Utchanah et al., "An investigation on the potential of extracting natural dyes from beetroot and turmeric," International Journal of Research in Engineering and Technology, Feb. 2015, vol. 4, pp. 401-416.
Any identified foreign patents and/or publications were properly submitted in parent U.S. Appl. No. 15/0998,242, filed Apr. 13, 2016, the priority of which is claimed.

* cited by examiner

*Primary Examiner* — Angelo Trivisonno
(74) *Attorney, Agent, or Firm* — Nath, Goldberg & Meyer; Richard C. Litman

(57) ABSTRACT

The flexible dye-sensitized solar panel with an organic chromophore is formed from an organic chromophore dye in a polymer matrix. The organic chromophore dye is extracted from chard (*B. vulgaris* subsp. *cicla*). The polymer matrix may be formed from either poly(vinyl alcohol) or polystyrene. The flexible dye-sensitized solar panel with an organic chromophore is made by preparing a solution of the selected polymer in the dye extracted from the *B. vulgaris* subsp. *cicla*. The solution is coated on a glass plate and dried to form a thin film. The thin flexible film is removed from the plate, forming the flexible dye-sensitized solar panel with an organic chromophore.

10 Claims, No Drawings

FLEXIBLE SOLAR PANEL

CROSS REFERENCE TO RELATED APPLICATIONS

This application is a divisional application of Ser. No. 15/098,242, filed Apr. 13, 2016, the priority of which is claimed.

BACKGROUND OF THE INVENTION

1. Field of the Invention

The present invention relates to solar cells, solar panels and the like, and particularly to a flexible solar panel including an extract of chard (*B. vulgaris* subsp. *cicla*).

2. Description of the Related Art

A dye-sensitized solar cell is a type of thin film solar cell. The dye-sensitized solar cell has a number of attractive features, such as its relatively easy and low-cost manufacture, typically by conventional roll-printing techniques. However, in the manufacture of dye-sensitized solar cells, it has proven difficult to eliminate or reduce a number of expensive materials, notably platinum and ruthenium. Thus, a flexible solar panel solving the aforementioned problems is desired.

SUMMARY OF THE INVENTION

The flexible solar panel includes a polymer matrix and a plant extract incorporated in the polymer matrix. The plant extract can be an extract of chard (*B. vulgaris* subsp. *cicia*). The plant extract can include chloroplasts. The polymer matrix may be formed from either poly(vinyl alcohol) or polystyrene.

These and other features of the present invention will become readily apparent upon further review of the following specification.

DETAILED DESCRIPTION OF THE PREFERRED EMBODIMENTS

The flexible solar panel includes a polymer matrix and a plant extract incorporated in the polymer matrix. The plant extract can include chloroplasts. The plant extract can include an organic dye or an organic chromophore. The plant extract can be an extract of chard (*B. vulgaris* subsp. *cicla*). The polymer matrix may be formed from either poly(vinyl alcohol) or polystyrene.

In order to make the flexible solar panel, a green colored extract of *B. vulgaris* subsp. *cicla* is first prepared. A polystyrene (PS) solution, e.g., polystyrene dissolved in toluene, can then be mixed with the extract of *B. vulgaris* subsp. *cicla*. The mixture can then be allowed to dry to produce a flexible green colored sheet, or solar panel. For example, the mixture can be disposed on a glass plate at room temperature for about 48 hours and then removed from the plate.

Alternatively, polyvinyl alcohol (PVA), instead of the polystyrene solution (PS), may be added to a first amount of *B. vulgaris* subsp. *cicla* extract until completely dissolved to form a first mixture. Then, a second amount of the *B. vulgaris* subsp. *cicla* extract is added to the mixture to produce a second mixture. The mixture can then be allowed to dry to produce a flexible green colored sheet, or solar panel. For example, the mixture can be disposed on a glass plate at room temperature for about 48 hours and then removed from the plate.

These and other features of the present invention will become readily apparent upon further review of the following specification and drawings.

Example 1

A green extract of the *B. vulgaris* subsp. *cicla* was prepared by washing half of a conventional sized bag of *B. vulgaris* subsp. *cicla* leaves, and then blending the leaves in approximately 200 mL of water. The leaves were ground in the water for between 5 and 10 minutes until the leaves were thoroughly blended. The blended leaves in the water were then centrifuged at 9,000 rpm for 10 minutes to produce the green colored *B. vulgaris* subsp. *cicla* extract.

The flexible solar panel was then made by dissolving 3 grams of poly(vinyl alcohol) in 30-50 mL of the *B. vulgaris* subsp. *cicla* dye under vigorous stirring at 60° C. to form a first solution. Stirring was performed until the poly(vinyl alcohol) (PVA) was completely dissolved in the *B. vulgaris* subsp. *cicla* dye. An additional 10-30 mL of the *B. vulgaris* subsp. *cicla* dye was then added to the first solution, until completely mixed, to form a second solution. The second solution was then coated on a glass plate. The second solution was dried on the plate at room temperature for 48 hours to form a flexible green film, which was then removed from the plate. The flexible green film removed from the plate formed the flexible solar panel.

Solar panels produced by the above method were exposed to light from a 12 volt lamp (emitting a mean intensity of 700 lux) and then tested for current generation and the values of the voltage using a microvolt digital multimeter, such as the Model 177 Microvolt DMM, manufactured by Keithley Instruments, Inc. of Cleveland, Ohio. Under illumination, the solar panels were found to generate a voltage of −22.9 mV and current of −0.2935897 mA. In the absence of light, the multimeter measured a voltage of approximately −44.6 mV and a current of approximately −0.3811966 mA, thus showing a clear increase of current and voltage generation upon exposure to light.

A control panel, formed without the *B. vulgaris* subsp. *cicla* dye, produced zero current or potential difference in the presence of light. Thus, the observed current generation and induced potential difference of the green flexible solar film is due to the presence of chloroplasts in the *B. vulgaris* subsp. *cicla* extract, rather than any other conventional electron motive force generating factor.

Example 2

A green extract of the *B. vulgaris* subsp. *cicla* was prepared by washing half of a conventional sized bag of *B. vulgaris* subsp. *cicla* leaves, and then blending the leaves in approximately 200 mL of ethanol. The leaves were ground in the ethanol for between 5 and 10 minutes until the leaves were thoroughly blended. The blended leaves in the ethanol were then centrifuged at 9,000 rpm for 10 minutes to produce the *B. vulgaris* subsp. *cicla* extract. The *B. vulgaris* subsp. *cicla* chromophore extract was green in color.

The flexible solar panel was then made by dissolving 4 grams of polystyrene in 30-60 mL of toluene under vigorous stirring at 60° C. to form a first solution. Stirring was performed until the polystyrene (PS) was completely dissolved in the toluene. 30-50 mL of the *B. vulgaris* subsp. *cicla* extract was added to the first solution, until completely mixed, to form a second solution. The second solution was then coated on a glass plate. The second solution was dried on the plate at room temperature for 48 hours to form a flexible green film, which was then removed from the plate. The flexible green film removed from the plate formed the flexible solar panel.

Solar panels produced by the above method were exposed to light from a 12 volt lamp (emitting a mean intensity of 700 lux) and then tested for current generation and the values of the voltage using a microvolt digital multimeter, such as the Model 177 Microvolt DMM, manufactured by Keithley Instruments, Inc. of Cleveland, Ohio. Under illumination, the solar panels were found to generate a voltage of −27.1 mV and current of −0.14 mA. In the absence of light, the multimeter measured a voltage of approximately −42.5 mV and a current of approximately −0.21 mA, thus showing a clear increase of current and voltage generation upon exposure to light.

Example 3

In a third example, silver nanoparticles, zinc oxide nanoparticles and titanium dioxide nanoparticles were each added separately to the poly(vinyl alcohol) and the *B. vulgaris* subsp. *cicla* extract solution, and the solutions were cast on glass plates to dry at room temperature. Each solar panel was tested in a manner similar to that described above for Examples 1 and 2; i.e., the solar panels produced by the above method were exposed to light from a 12 volt lamp (emitting a mean intensity of 700 lux) and then tested for current generation and the values of the voltage using a microvolt digital multimeter, such as the Model 177 Microvolt DMM, manufactured by Keithley Instruments, Inc. of Cleveland, Ohio.

Under illumination, the solar panels produced with just the silver nanoparticles were found to generate a voltage of −59 mV and a current of −0.124 mA. In the absence of light, the multimeter measured a voltage of approximately −106 mV and a current of approximately −0.223 mA, thus showing a clear increase of current and voltage generation upon exposure to light. For the solar panels produced with only zinc oxide nanoparticles, the solar panels were found to generate a voltage of −19.8 mV and a current of −0.099 mA under illumination. In the absence of light, the multimeter measured a voltage of approximately −61.4 mV and a current of approximately −0.2193 mA, thus showing a clear increase of current and voltage generation upon exposure to light. Similarly, for the solar panels produced with only titanium dioxide nanoparticles, under illumination, the solar panels were found to generate a voltage of −16 mV and a current of −0.213 mA. In the absence of light, the multimeter measured a voltage of approximately −32.4 mV and a current of approximately −0.85 mA, thus showing a clear increase of current and voltage generation upon exposure to light.

It is to be understood that the present invention is not limited to the embodiments described above, but encompasses any and all embodiments within the scope of the following claims.

We claim:

1. A method of making a flexible solar panel, comprising the steps of:
    dissolving poly(vinyl alcohol) in a first amount of *B. vulgaris* subsp. *cicla* extract to form a first solution, the first amount of *B. vulgaris* subsp. *cicla* extract consists of a green colored extract of *B. vulgaris* subsp. *cicla*, wherein the extract includes chloroplasts;
    adding a second amount of *B. vulgaris* subsp. *cicla* extract to the first solution to form a second solution, the second amount of *B. vulgaris* subsp. *cicla* extract consists of a green colored extract of *B. vulgaris* subsp. *cicla*, wherein the extract includes chloroplasts;
    coating a plate with the second solution;
    drying the second solution on the plate to form a flexible film; and
    removing the flexible film from the plate, wherein the flexible film forms the flexible solar panel.

2. The method of making a flexible solar panel as recited in claim 1, wherein the step of dissolving the poly(vinyl alcohol) in the *B. vulgaris* subsp. *cicla* extract to form the first solution comprises adding the poly(vinyl alcohol) to the *B. vulgaris* subsp. *cicla* extract under stirring at a temperature of 60° C.

3. The method of making a flexible solar panel as recited in claim 2, wherein the step of coating the plate with the second solution comprises coating a glass plate with the second solution.

4. The method of making a flexible solar panel as recited in claim 3, wherein the step of drying the second solution on the plate comprises drying the second solution on the plate for 48 hours at room temperature.

5. The method of making a flexible solar panel as recited in claim 1, further comprising the steps of:
    blending leaves of *B. vulgaris* subsp. *cicla* in water; and
    centrifuging the blended leaves of B. vulgaris subsp. cicla in the water to produce the extract of *B. vulgaris* subsp. *cicla*.

6. A method of making a flexible solar panel, comprising the steps of:
    dissolving polystyrene in toluene to form a first solution;
    adding *B. vulgaris* subsp. *cicla* dye to the first solution to form a second solution, the *B. vulgaris* subsp. *cicla* dye consists of a green colored extract of *B. vulgaris* subsp. *cicla*, wherein the extract includes chloroplasts;
    coating a plate with the second solution;
    drying the second solution on a plate to form a flexible film; and
    removing the flexible film from the plate, wherein the flexible film comprises the flexible solar panel.

7. The method of making a flexible solar panel as recited in claim 6, wherein the step of dissolving the polystyrene in the toluene to form the first solution comprises adding the polystyrene to the toluene under stirring at a temperature of 60° C.

8. The method of making a flexible solar panel as recited in claim 7, wherein the step of coating the plate with the second solution comprises coating a glass plate with the second solution.

9. The method of making a flexible solar panel as recited in claim 8, wherein the step of drying the second solution on the plate comprises drying the second solution on the plate for 48 hours at room temperature.

10. The method of making a flexible solar panel as recited in claim 6, further comprising the steps of:
    blending leaves of *B. vulgaris* subsp. *cicla* in ethanol; and
    centrifuging the blended leaves of *B. vulgaris* subsp. *cicla* in the ethanol to produce the extract of *B. vulgaris* subsp. *cida*.

* * * * *